United States Patent
Chen et al.

(12)

(10) Patent No.: US 6,297,127 B1
(45) Date of Patent: Oct. 2, 2001

(54) SELF-ALIGNED DEEP TRENCH ISOLATION TO SHALLOW TRENCH ISOLATION

(75) Inventors: Bomy A. Chen, Stormville; Liang-Kai Han, Fishkill; Robert Hannon; Jay G. Harrington, both of Wappingers Falls; Herbert L. Ho, Cornwall; Hsing-Jen Wann, Briarcliff Manor, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/599,699

(22) Filed: Jun. 22, 2000

(51) Int. Cl.$^7$ .................................................. H01L 21/76
(52) U.S. Cl. .................... 438/424; 438/153; 438/163; 438/425; 257/69

(58) Field of Search ............................... 438/153, 163, 438/424, 425; 257/69, 903

(56) References Cited

U.S. PATENT DOCUMENTS 5,320,975 * 6/1994 Cedarbaum et al. ................ 438/153

* cited by examiner

Primary Examiner—David Nelms
Assistant Examiner—Reneé R. Berry
(74) Attorney, Agent, or Firm—Eric W. Petraske

(57) ABSTRACT

Shallow trench isolation is combined with optional deep trenches that are self-aligned with the shallow trenches, at the corners of the shallow trenches, and have a deep trench width that is controlled by the thickness of a temporary sidewall deposited in the interior of the shallow trench and is limited by the sidewall deposition thickness of the deep trench fill.

9 Claims, 4 Drawing Sheets

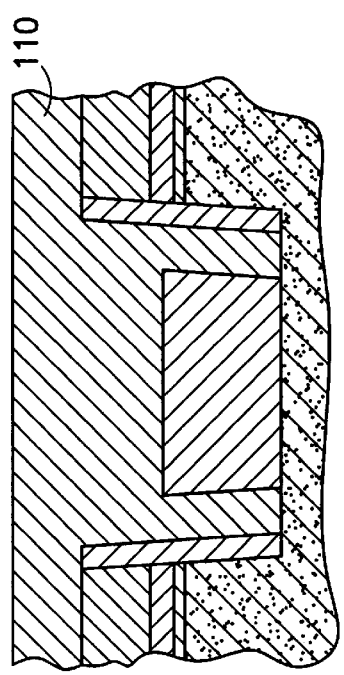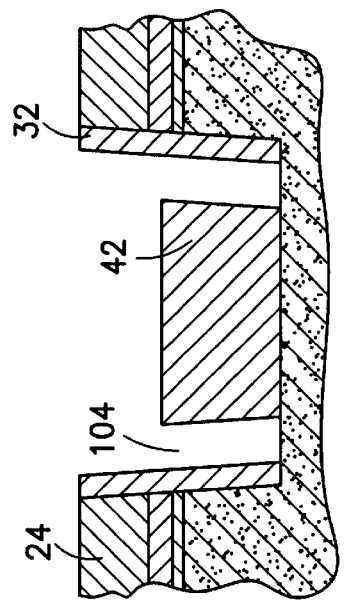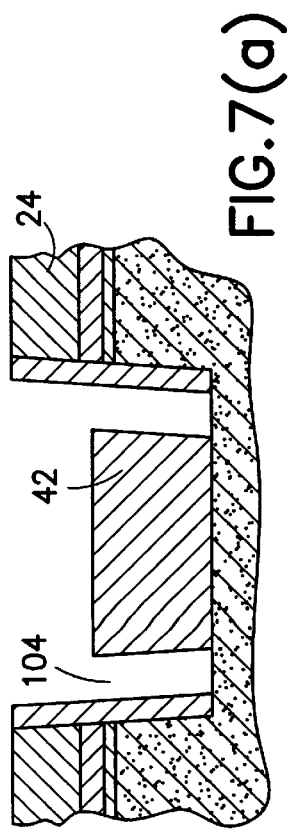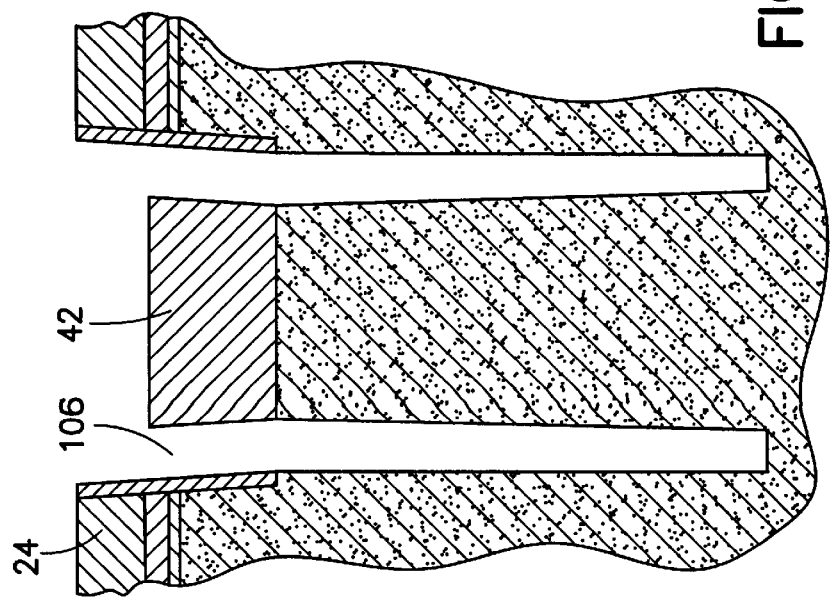

SELF-ALIGNED DEEP TRENCH ISOLATION TO SHALLOW TRENCH ISOLATION

FIELD OF THE INVENTION

The field of the invention is integrated circuit processing using shallow trench isolation (STI) to separate circuit elements.

BACKGROUND OF THE INVENTION

STI has come into widespread use in the semiconductor industry because of its space savings as compared with the old LOCOS isolation.

In an active well circuit, where the wells are actively biased to improve the device performance, a solid and constant isolation is needed between the wells. The isolation must be deeper (~2μm) than the shallow isolation (~0.25 μm) between devices.

It is not enough, however, to have only deep trenches because device isolation using deep trenches would require body contacts, as in silicon on insulator technology, and would consume a great deal of space.

In addition, it is not practical to have varying widths of deep trenches because of the nature of the filling mechanism. Ordinarily, a deep trench is filled by growth of a layer adhering to the walls of the trench, so that the thickness of the fill layer can be much less than the width of the trench. This mechanism does not work for wide deep trenches. When the width of the trench is greater than twice the depth, the thickness of the fill layer must be at least the depth of the trench; i.e. a wide deep trench would require a 2 μm thick fill layer.

The combination of shallow and deep trenches has been suggested in the past, but the previous approaches have suffered from various practical problems.

If the deep trenches are not self-aligned to the shallow trenches, the deep trench can overlap the devices that are isolated by the trenches, so that the device size is not correct for that process.

SUMMARY OF THE INVENTION

The invention relates to a shallow trench isolation that is combined with optional deep trenches and the process for forming the isolation.

A feature of the invention is that the deep trenches are self-aligned with the shallow trenches, at the edges of the shallow trenches.

Another feature of the invention is that deep trench width is controlled by the thickness of a temporary sidewall spacer deposited in the interior of the shallow trench.

Another feature of the invention is that the deep trench width is limited by the sidewall deposition thickness of the deep trench fill in the case in which the two deep trenches entirely fill the shallow trench.

BRIEF DESCRIPTION OF THE DRAWINGS

FIGS. 1 through 10 show in cross section shallow/deep trenches in various stages of fabrication according to the invention.

DESCRIPTION OF THE PREFERRED EMBODIMENT

Referring now to FIGS. 1 through 10, there is shown a portion of an integrated circuit at various stages in the process. Each figure represents the results of a step in the process.

Figure 1:
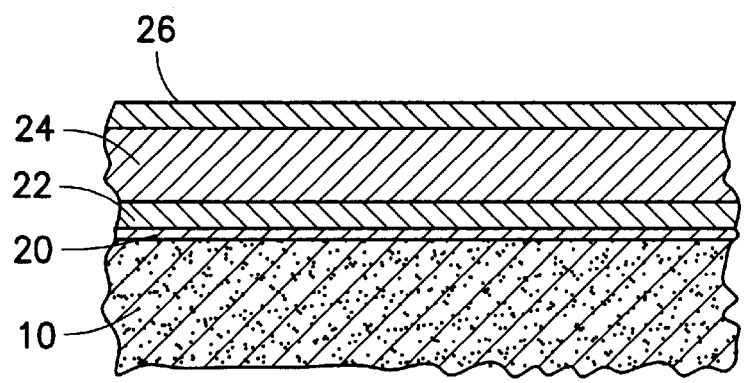

Initially as shown in FIG. 1, silicon substrate 10 has a pad oxide ($SiO_2$) layer 20 of initial thickness 8 μnm, pad nitride ($Si_3N_4$) layer 22 of initial thickness 80 μnm, second oxide (first polish stop layer) 24 of initial thickness 150 nm, and second nitride (second polish stop layer) 26 of initial thickness 80 nm. These thicknesses are relevant to a particular process. The choice of thicknesses will be explained below.

Figure 2:
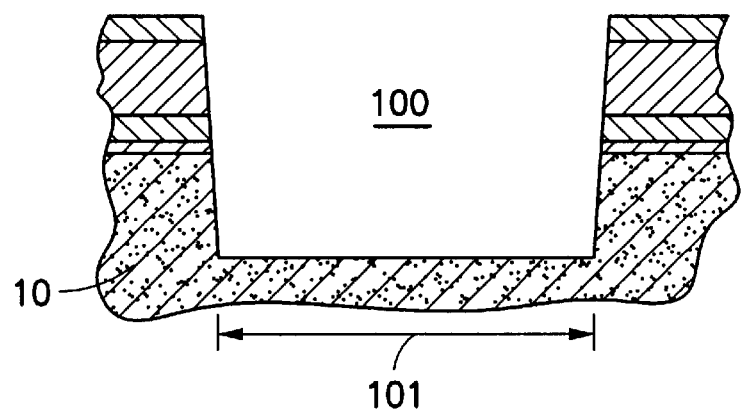

An aperture 100 sized for the shallow trench and having a nominal width 101 of 1 μnm is etched a nominal 300 nm into the silicon substrate, using a conventional reactive ion etch (RIE) with conventional $Ar:NF_3$ or $HBr:HeO_2$ chemistry. The result is shown in FIG. 2, with vertical interior sidewalls on the left and right of the trench.

Figure 3:
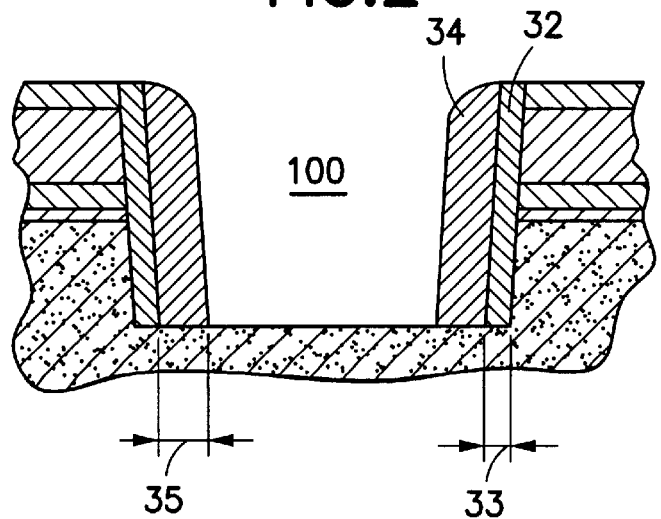
Figure 4:
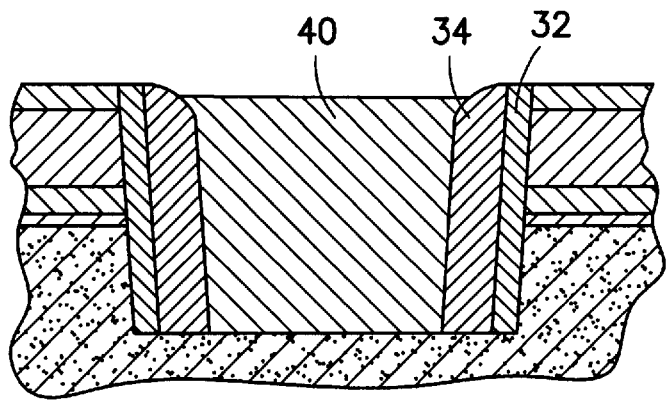

A composite interior spacer is deposited within the shallow trench and directionally etched using conventional chemistry to expose the silicon at the bottom of the shallow trench and also to remove the spacer films outside the trench. The first spacer layer 32 is oxide, having a nominal thickness of 4 nm. The second spacer layer 34 is nitride, having a nominal thickness of 130 nm. The result is shown in FIG. 3.

Second nitride 26 should be thick enough to protect oxide 24 during this step and also to act as a polish stop in the next CMP step of polishing the oxide trench fill, i.e. the residue of layer 26 is thick enough to be an effective polish stop.

The shallow trench aperture 100 is filled with oxide 40 that is subject to a chemical-mechanical polish (CMP) operation to remove the oxide outside the shallow trench. The result is a shallow trench filled with oxide, shown in FIG. 4.

Figure 5:
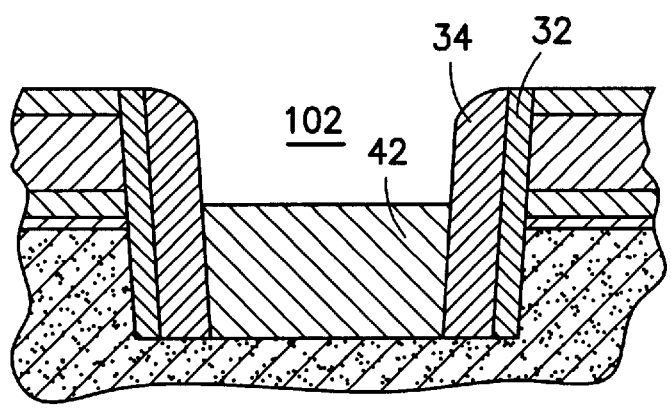

The oxide fill 40 is recessed to a nominal remaining thickness of 350 nm using a conventional wet or dry etch selective to nitride, leaving an etch-resistant plug 42 below an aperture 102. This sequence is preferred because it is insensitive to the various trench widths that may be involved. The result is shown in FIG. 5.

Figure 6:
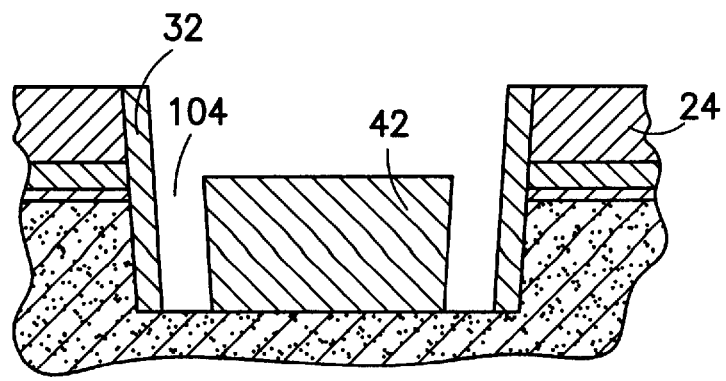

Nitride spacer 34 and the residue of second nitride 24 are stripped in a conventional wet process with hot phosphoric acid, leaving oxide plug 42, with apertures 104 on either side. The result is shown in FIG. 6. Oxide plug 42 and the oxide spacer layer 32 serve as a hard mask for the deep trench etch that follows in the next step. The width of the deep trench will be set by thickness 35 of spacer 34 and the offset distance of the deep trench will be determined by the thickness 33 of oxide spacer 32. The result is shown in FIG. 6.

FIG. 7(a) is the same as FIG. 6. FIG. 7(b) shows the result of depositing photoresist with a block mask to prevent deep trench etching in selected areas of the chip.

Next, a deep trench etch is performed, using $HBR: O_2$: $NF_3$ chemistry to give a high aspect ratio aperture 106. The nominal depth is 2 μm and the nominal width is 0.15 μm, the thickness of spacer layer 34. The result is shown in FIG. 8(a). FIG. 8(b) shows the protected shallow trench after a resist strip.

Figure 9A:
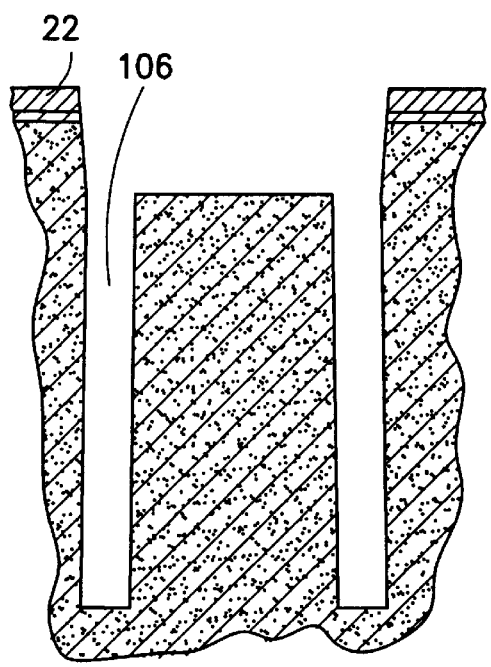
Figure 9B:
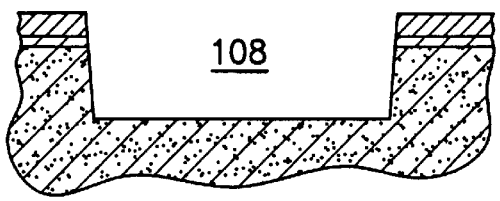

FIGS. 9(a) and 9(b) show the deep and shallow trenches after an oxide strip step using vapor phase HF or similar chemistry and a conventional cleaning step to remove metallics, organics and polymeric residuals.

Figure 10A:
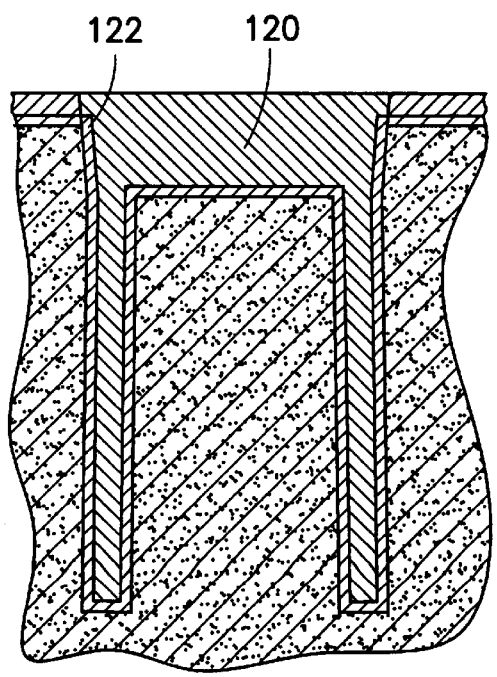
Figure 10B:
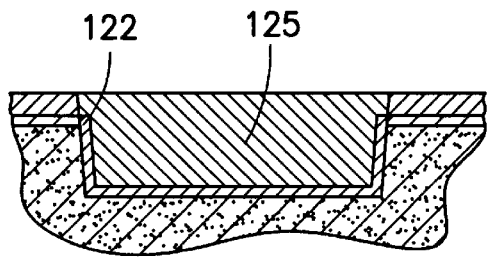

Lastly, a layer of 12 nm of thermal oxide is grown on the sides and bottoms of the deep and shallow trenches; the trenches are filled with HDP oxide and planarized with conventional CMP. The result is shown in FIG. 10.

Preferably, an LPCVD oxide is used for both shallow and deep trenches. In the event that geometry does not allow this in a particular case, an alternative is to fill the deep trenches with polysilicon then recess the deep trenches to about the depth of the shallow trenches and fill both trenches with conventional oxide fill for shallow trenches.

In the limiting case of large spacer width 35 and a narrow shallow trench width 101, the two deep trenches will meet and a single deep trench will be etched. In order to fill this limiting case, the thickness of film 35 should be at least half the width 101 of the trench and less than the sidewall deposition thickness—the maximum thickness that can be deposited with a particular fill material and filling technique.

The use of the invention is not confined to active well circuits and it may be used with conventional CMOS circuits as well.

The materials listed are illustrative only and other materials having appropriate etching and etch resisting properties may be used.

While the invention has been described in terms of a single preferred embodiment, those skilled in the art will recognize that the invention can be practiced in various versions within the spirit and scope of the following claims.

We claim:

1. A method of forming an integrated circuit having a set of deep isolation trenches aligned with shallow isolation trenches, comprising the steps of:

depositing consecutively on a silicon substrate a set of layers comprising a pad oxide layer, a pad nitride layer, a first polish stop layer and a second polish stop layer;

etching a set of shallow trenches through said set of layers and into said silicon substrate, said set of shallow trenches having interior sidewalls;

forming interior spacers on the interior sidewalls of said shallow trenches;

forming an etch-resistant plug within at least some of said set of shallow trenches and between said interior spacers;

removing said interior spacers, thereby forming a set of deep trench apertures between said etch-resistant plugs and said interior sidewalls of said shallow trenches;

etching a set of deep trenches in said deep trench apertures; and filling said deep trenches and said shallow trenches with an insulating material.

2. A method according to claim 1, further comprising the steps of:

blocking a shallow trench subset of said set of shallow trenches before said step of etching a set of deep trenches in said deep trench apertures, whereby a first subset of shallow trenches has deep trenches therewithin and a second subset of shallow trenches does not have deep trenches therewithin.

3. A method according to claim 1, in which said step of forming interior spacers on the interior sidewalls of said shallow trenches comprises the steps of depositing a spacer film and etching horizontal portions of said spacer film in a directional etch to expose silicon at the bottom of said shallow trenches, using second polish stop layer as an etch stop and leaving a residue thereof sufficient to serve as a polish stop;

said step of forming an etch-resistant plug within said shallow trenches and between said spacers comprises the steps of depositing a plug layer of etch-resistant material and removing that portion of said etch-resistant material outside said set of shallow trenches in a chemical-mechanical polishing operation, using said residue of said second polish stop layer as a polish stop, whereby said shallow trenches are filled with a layer of said etch-resistant material, thereafter recessing said layer of etch-resistant material, thereby forming said etch-resistant plug and thereafter stripping said second polish stop layer; and said step of etching a set of deep trenches in said deep trench apertures employs said etch-resistant plug and said first polish stop layer as a mask.

4. A method according to claim 1, in which said first polish stop is oxide, said second polish stop is nitride, and said etch-resistant plug is formed of oxide.

5. A method according to claim 1, further comprising the steps of:

forming a set of P-wells and N-wells within said substrate for the formation therewithin of NFETs and PFETs, said set of deep trenches being disposed to separate said P-wells and N-wells.

6. A method according to claim 2, further comprising the steps of:

forming a set of P-wells and N-wells within said substrate for the formation therewithin of NFETs and PFETs, said set of deep trenches being disposed to separate said P-wells and N-wells.

7. A method according to claim 3, further comprising the steps of:

forming a set of P-wells and N-wells within said substrate for the formation therewithin of NFETs and PFETs, said set of deep trenches being disposed to separate said P-wells and N-wells.

8. A method according to claim 1, in which:

at least a subset of said interior spacers has a thickness greater than one half of a shallow trench thickness, whereby said subset of interior spacers fill the shallow trenches within which they are formed and a single deep trench is etched therewithin.

9. A method according to claim 2, in which:

at least a subset of said interior spacers has a width greater than one half of a shallow trench width, whereby said subset of interior spacers fill the shallow trenches within which they are formed and a single deep trench is etched therewithin.

* * * * *